(12) United States Patent
Ochi et al.

(10) Patent No.: US 10,164,118 B2
(45) Date of Patent: Dec. 25, 2018

(54) SEMICONDUCTOR DEVICE AND METHOD FOR PRODUCING SAME

(71) Applicant: Sharp Kabushiki Kaisha, Sakai, Osaka (JP)

(72) Inventors: Hisao Ochi, Sakai (JP); Tohru Daitoh, Sakai (JP); Hajime Imai, Sakai (JP); Tetsuo Fujita, Sakai (JP); Hideki Kitagawa, Sakai (JP); Tetsuo Kikuchi, Sakai (JP); Masahiko Suzuki, Sakai (JP); Shingo Kawashima, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/531,424

(22) PCT Filed: Nov. 19, 2015

(86) PCT No.: PCT/JP2015/082498
§ 371 (c)(1),
(2) Date: May 27, 2017

(87) PCT Pub. No.: WO2016/084687
PCT Pub. Date: Jun. 2, 2016

(65) Prior Publication Data
US 2017/0330975 A1    Nov. 16, 2017

(30) Foreign Application Priority Data

Nov. 28, 2014 (JP) .................................. 2014-242535

(51) Int. Cl.
*H01L 29/10*     (2006.01)
*H01L 29/786*    (2006.01)
(Continued)

(52) U.S. Cl.
CPC ........ *H01L 29/78618* (2013.01); *C23C 14/08* (2013.01); *G02F 1/1368* (2013.01);
(Continued)

(58) Field of Classification Search
CPC ..... H01L 33/62; H01L 51/0072; H01L 51/56; H01L 33/60; H01L 2251/558
(Continued)

(56) References Cited

U.S. PATENT DOCUMENTS

2012/0138922 A1    6/2012 Yamazaki et al.
2012/0319112 A1*  12/2012 Cho ..................... H01L 29/45
                                                          257/57
(Continued)

FOREIGN PATENT DOCUMENTS

JP    2012-134475 A    7/2012
JP    2013-254951 A   12/2013
(Continued)

Primary Examiner — Andy Huynh
(74) Attorney, Agent, or Firm — ScienBiziP, P.C.

(57) ABSTRACT

A semiconductor device (100A) includes a substrate (101) and a thin film transistor (10) supported by the substrate. The thin film transistor includes a gate electrode (102), an oxide semiconductor layer (104), a gate insulating layer (103), a source electrode (105) and a drain electrode (106). The oxide semiconductor layer includes an upper semiconductor layer (104b) which is in contact with the source electrode and the drain electrode and which has a first energy gap, and a lower semiconductor layer (104a) which is provided under the upper semiconductor layer and which has a second energy gap that is smaller than the first energy gap. The source electrode and the drain electrode include a lower layer electrode (105a, 106a) which is in contact with the oxide semiconductor layer and which does not contain Cu, and a major layer electrode (105b, 106b) which is provided over the lower layer electrode and which contains Cu. An (Continued)

edge of the lower layer electrode is at a position ahead of an edge of the major layer electrode.

12 Claims, 8 Drawing Sheets

(51) Int. Cl.

| | | |
|---|---|---|
| *C23C 14/08* | (2006.01) | |
| *G02F 1/1368* | (2006.01) | |
| *H01L 21/28* | (2006.01) | |
| *H01L 29/417* | (2006.01) | |
| *H01L 51/50* | (2006.01) | |
| *G02F 1/1343* | (2006.01) | |
| *H01L 21/02* | (2006.01) | |
| *H01L 21/441* | (2006.01) | |
| *H01L 21/4763* | (2006.01) | |
| *H01L 27/12* | (2006.01) | |
| *H01L 29/24* | (2006.01) | |
| *H01L 29/45* | (2006.01) | |
| *H01L 29/66* | (2006.01) | |

(52) U.S. Cl.
CPC .... *G02F 1/13439* (2013.01); *G02F 1/134309* (2013.01); *H01L 21/02565* (2013.01); *H01L 21/02631* (2013.01); *H01L 21/28* (2013.01); *H01L 21/441* (2013.01); *H01L 21/47635* (2013.01); *H01L 27/127* (2013.01); *H01L 27/1225* (2013.01); *H01L 29/24* (2013.01); *H01L 29/417* (2013.01); *H01L 29/45* (2013.01); *H01L 29/66969* (2013.01); *H01L 29/786* (2013.01); *H01L 29/7869* (2013.01); *H01L 29/78696* (2013.01); *H01L 51/50* (2013.01); *G02F 2001/134372* (2013.01); *G02F 2202/10* (2013.01)

(58) Field of Classification Search
USPC .......................................................... 257/43
See application file for complete search history.

(56) References Cited

U.S. PATENT DOCUMENTS

| | | |
|---|---|---|
| 2013/0207111 A1 | 8/2013 | Yamazaki |
| 2013/0300456 A1 | 11/2013 | Lennon |
| 2013/0320334 A1 | 12/2013 | Yamazaki et al. |
| 2014/0001465 A1* | 1/2014 | Yamazaki ......... H01L 29/66969 257/43 |
| 2014/0014952 A1 | 1/2014 | Katsui et al. |
| 2014/0021466 A1 | 1/2014 | Yamazaki |
| 2014/0110707 A1 | 4/2014 | Koezuka et al. |
| 2014/0286076 A1 | 9/2014 | Aoki et al. |
| 2015/0115264 A1 | 4/2015 | Kato |

FOREIGN PATENT DOCUMENTS

| | | |
|---|---|---|
| JP | 2014-007399 A | 1/2014 |
| JP | 2014-022492 A | 2/2014 |
| JP | 2014-032999 A | 2/2014 |
| JP | 2014-103390 A | 6/2014 |
| JP | 2014-209727 A | 11/2014 |
| TW | 201338174 A | 9/2013 |
| WO | 2012/108301 A | 8/2012 |

* cited by examiner (a)

(b)

SEMICONDUCTOR DEVICE AND METHOD FOR PRODUCING SAME

TECHNICAL FIELD

The present invention relates to a semiconductor device formed using an oxide semiconductor and a manufacturing method thereof.

BACKGROUND ART

An active matrix substrate for use in liquid crystal display devices, or the like, includes a switching element, such as a thin film transistor (hereinafter, "TFT"), in each pixel. Known examples of such a switching element include a TFT in which an oxide semiconductor layer is used as the active layer (hereinafter, referred to as "oxide semiconductor TFT"). Patent Document 1 discloses a liquid crystal display device in which InGaZnO (an oxide including indium, gallium and zinc) is used in the active layer of the TFT.

The oxide semiconductor TFT is capable of operating at a higher speed than the amorphous silicon TFT. The oxide semiconductor film is manufactured through a simpler process than the polycrystalline silicon film and is therefore applicable to devices which require a large area. Thus, the oxide semiconductor TFT is a promising candidate for a high-performance active element which can be manufactured with reduced manufacturing steps and a reduced manufacturing cost.

Since the mobility of the oxide semiconductor is high, it is possible to achieve equal or higher performance even if the size is reduced as compared with conventional amorphous silicon TFTs. Therefore, when an active matrix substrate of a display device is manufactured using the oxide semiconductor TFT, the area occupancy of the TFT in each pixel can be reduced, and the pixel aperture ratio can be improved. Accordingly, bright display can be realized even with a reduced amount of light from the backlight, and low power consumption can be realized.

Since the off-leak characteristic of the oxide semiconductor TFT is excellent, it is possible to utilize an operation mode in which display is performed with reduced image rewriting frequency. For example, in the case of displaying a still image, it is possible to operate the TFT so as to rewrite the image data once every second. Such a driving method is referred to as "intermittent driving" or "low frequency driving" and is capable of greatly reducing the power consumption by the display device.

CITATION LIST

Patent Literature

Patent Document 1: Japanese Laid-Open Patent Publication No. 2012-134475
Patent Document 2: Japanese Laid-Open Patent Publication No. 2014-7399
Patent Document 3: WO 2012/108301
Patent Document 4: Japanese Laid-Open Patent Publication No. 2014-32999

SUMMARY OF INVENTION

Technical Problem

Note that, however, the oxide semiconductor TFT has such a problem that a metal element contained in the source/drain layer (hereinafter, also referred to as "SD layer") diffuses into the oxide semiconductor layer so that the TFT characteristics, such as threshold voltage, vary. On the other hand, Patent Document 2 discloses the technique of configuring the oxide semiconductor layer by two layers of different composition ratios, the upper layer being in contact with the SD layer and the lower layer being provided under the upper layer. In this configuration, the upper oxide semiconductor layer is used as a buffer layer for suppressing diffusion of an element from the SD layer, and the lower oxide semiconductor layer is used as a substantial channel.

Meanwhile, wires and electrodes in active matrix substrates have been required to have lower resistances in order to comply with larger screen sizes and higher definitions of liquid crystal display devices. To this end, using Cu (copper) or a Cu alloy (e.g., CuCa alloy, CuMgAl alloy or CuMn alloy), which has lower electrical resistance than Al, as source wires (including source electrodes and drain electrodes) and gate wires has been known.

Note that, however, there is a probability that Cu diffuses into the semiconductor layer and contaminates the channel so that the device characteristics become unstable. On the other hand, Patent Document 3 discloses the technique of suppressing diffusion of Cu into the channel, which is realized by using Cu as the upper layer signal electrode and Ti as the lower layer signal electrode and arranging these electrodes in a stepped configuration. Patent Document 4 describes a wire configuration in which Cu or a Cu alloy is used as a low resistance layer, and a molybdenum alloy layer which contains nickel and niobium is provided under or over the low resistance layer.

However, when Cu or a Cu alloy is used for the SD layer in an oxide semiconductor layer TFT, conventional countermeasures fail to completely suppress diffusion of Cu into the oxide semiconductor layer during a TFT manufacturing process. Therefore, there is a probability that the channel is contaminated so that desired device characteristics cannot be achieved.

According to research conducted by the present inventors, it was found that, particularly when Cu or a Cu alloy is used for a SD layer in an inversely staggered (bottom gate top contact type) TFT, Cu is likely to diffuse into the oxide semiconductor layer in a source-drain separation step. In a TFT of this configuration, the SD layer and the oxide semiconductor layer are partially etched away in the source-drain separation step such that the oxide semiconductor layer that is to be the underlayer is exposed (also referred to as "channel etch type"). If Cu diffuses into the channel region of the oxide semiconductor, the device characteristics greatly vary. Also, a protective insulating layer is provided so as to cover the exposed oxide semiconductor. In some cases, before formation of this protective insulating layer, a plasma treatment is performed on the oxide semiconductor layer using a gas which contains oxygen (e.g., $N_2O$ gas). Also in such a case, Cu is likely to diffuse into the oxide semiconductor layer, and the device characteristics are likely to vary.

According to a known bottom gate type configuration, an etch stop layer of $SiO_2$ or the like is provided so as to cover at least the channel formation region of the oxide semiconductor layer after the oxide semiconductor layer is provided and before the SD layer is provided (also referred to as "etch stop type"), even though it is of a bottom gate type. In the case of an etch stop type TFT, diffusion of Cu from the SD layer into the oxide semiconductor layer can be suppressed by the etch stop layer. Note that, however, it is necessary to add the step of providing the etch stop layer and, thus, the above-described channel etch type configuration is advantageous in terms of cost reduction. Using the channel etch type configuration is also advantageous in terms of reducing the size of the TFT.

The present invention was conceived in view of the above-described problems. One of the objects of the present invention is to use low-resistance wires and realize stable TFT characteristics in a semiconductor device which includes an oxide semiconductor TFT.

Solution to Problem

A semiconductor device according to an embodiment of the present invention includes: a substrate; and a thin film transistor supported by the substrate, the thin film transistor including a gate electrode, an oxide semiconductor layer, a gate insulating layer provided between the gate electrode and the oxide semiconductor layer, and a source electrode and a drain electrode which are electrically connected to the oxide semiconductor layer, wherein the oxide semiconductor layer includes an upper semiconductor layer which is in contact with the source electrode and the drain electrode and which has a first energy gap, and a lower semiconductor layer which is provided under the upper semiconductor layer and which has a second energy gap that is smaller than the first energy gap, the source electrode and the drain electrode include a lower layer electrode which is in contact with the oxide semiconductor layer and which does not contain Cu, and a major layer electrode which is provided over the lower layer electrode and which contains Cu, and an edge of the lower layer electrode is at a position ahead of an edge of the major layer electrode.

In one embodiment, the edge of the lower layer electrode is ahead of the edge of the major layer electrode by a distance of not less than 0.1 μm and not more than 1.0 μm.

In one embodiment, the edge of the lower layer electrode is ahead of the edge of the major layer electrode by a distance of not less than 0.2 μm and not more than 0.4 μm.

In one embodiment, the major layer electrode contains Cu in a proportion of not less than 90 at %, and the lower layer electrode contains Ti or Mo.

In one embodiment, the oxide semiconductor layer contains at least one metal element among In, Ga and Zn.

In one embodiment, the oxide semiconductor layer includes a crystalline portion.

In one embodiment, a Ga concentration in the upper semiconductor layer is higher than a Ga concentration in the lower semiconductor layer.

In one embodiment, in the upper semiconductor layer, the Ga concentration is higher than an In concentration, and in the lower semiconductor layer, the Ga concentration is not more than an In concentration.

In one embodiment, a thickness of the upper semiconductor layer is not less than 10 nm and not more than 80 nm, a thickness of the lower semiconductor layer is not less than 30 nm and not more than 100 nm, and the lower semiconductor layer is greater in thickness than the upper semiconductor layer.

In one embodiment, Cu is diffused in the upper semiconductor layer, and Cu is not diffused in the lower semiconductor layer.

In one embodiment, the source electrode and the drain electrode further include an upper layer electrode provided over the major layer electrode, and the upper layer electrode contains a Cu alloy or a Mo alloy.

In one embodiment, the thin film transistor has a channel etch structure.

A semiconductor device manufacturing method according to an embodiment of the present invention includes: providing a substrate; forming a gate electrode on the substrate; forming a gate insulating layer so as to cover the gate electrode; providing an oxide semiconductor layer on the gate insulating layer so as to partially overlap the gate electrode; and forming a source electrode and a drain electrode on the oxide semiconductor layer so as to be spaced away from each other, each of the source electrode and the drain electrode being connected with the oxide semiconductor layer, wherein the step of forming the oxide semiconductor layer includes forming a lower InGaZnO based semiconductor layer which has a first In concentration, and forming an upper InGaZnO based semiconductor layer on the lower InGaZnO based semiconductor layer, the upper InGaZnO based semiconductor layer having a second In concentration which is lower than the first In concentration, and the step of forming the source electrode and the drain electrode includes forming a lower layer film which does not contain Cu, forming a major layer film over the lower layer film, the major layer film containing Cu, wet etching the major layer film, thereby forming a major layer electrode, and dry etching the lower layer film, thereby forming a lower layer electrode.

In one embodiment, in the step of forming the source electrode and the drain electrode, the wet etching and the dry etching are performed such that an edge of the lower layer electrode is ahead of an edge of the major layer electrode by a distance of not less than 0.1 μm and not more than 1.0 μm.

In one embodiment, the step of forming the source electrode and the drain electrode includes dry etching the lower layer film which is formed so as to be in contact with the oxide semiconductor layer such that at least part of the oxide semiconductor layer is exposed, thereby forming a channel etch type thin film transistor.

In one embodiment, at least one of the upper InGaZnO based semiconductor layer and the lower InGaZnO based semiconductor layer includes a crystalline portion.

Advantageous Effects of Invention

According to one embodiment of the present invention, a semiconductor device is provided which is capable of realizing desirable oxide semiconductor TFT characteristics while achieving reduction in resistance of wires.

DESCRIPTION OF EMBODIMENTS

Hereinafter, a semiconductor device of an embodiment of the present invention is described with reference to the drawings. The semiconductor device of the present embodiment includes an oxide semiconductor TFT. Note that the semiconductor device of the present embodiment only needs to include an oxide semiconductor TFT and includes a wide variety of applications, such as active matrix substrates, various display devices, electronic devices, etc.

(First Embodiment)

Figure 1:
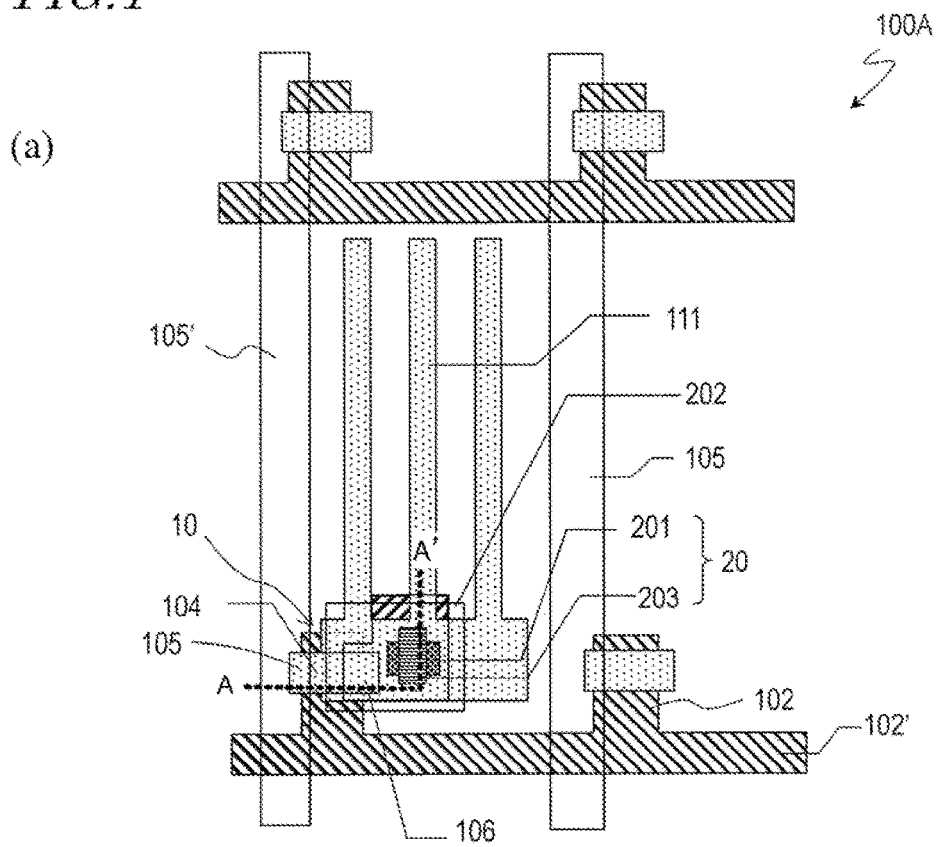
FIG. 1 A schematic cross-sectional view of a semiconductor device (active matrix substrate) of the first embodiment. (a) is a plan view. (b) is a cross-sectional view taken along line A-A' of (a).
Figure 1:
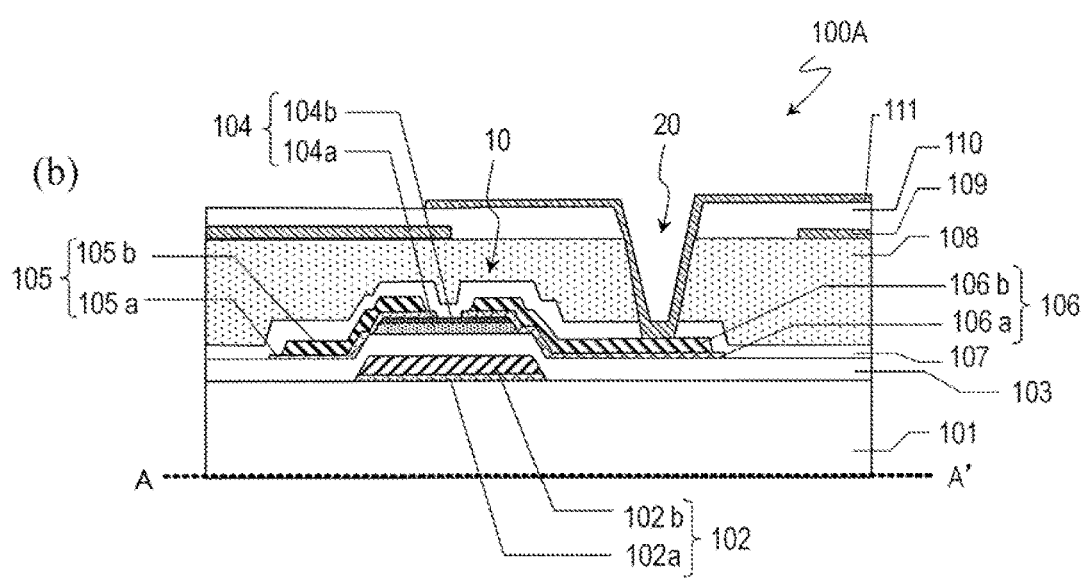

FIGS. 1(a) and 1(b) are a schematic plan view and a schematic cross-sectional view of a region corresponding to one pixel of an active matrix substrate (semiconductor device) 100A for use in a liquid crystal display device. FIG. 1(b) shows a cross section taken along line A-A' of FIG. 1(a).

The active matrix substrate 100A includes an oxide semiconductor TFT 10 provided on the substrate 101, a protecting layer (typically, inorganic insulating layer) 107 and a flattening layer (typically, organic insulating layer) 108, which are arranged so as to cover the oxide semiconductor TFT 10, and a pixel electrode 111 electrically connected to the oxide semiconductor TFT 10. The oxide semiconductor TFT 10 is driven by a scan line 102' extending in a horizontal direction and a signal line 105' extending in a vertical direction.

The active matrix substrate 100A of the present embodiment is used in a liquid crystal display device which operates in a FFS (Fringe Field Switching) mode. To this end, a common electrode 109 is provided on the flattening layer 108. The common electrode 109 is covered with an interlayer insulating layer (inorganic insulating layer) 110. The pixel electrode 111 is provided on the interlayer insulating layer 110 so as to oppose the common electrode 109.

The pixel electrode 111 includes a plurality of linear portions (or at least one slit) and is connected with the oxide semiconductor TFT 10 at the bottom of a contact hole 20 that is formed so as to penetrate through the interlayer insulating layer 110, the flattening layer 108 and the protecting layer 107. FIG. 1(a) shows that an opening 201 formed in the flattening layer 108 and an opening 203 formed in the interlayer insulating layer 110 are arranged so as to overlap, so that the contact hole 20 is formed. Meanwhile, the common electrode 109 has an opening 202 extending to an outer region of the contact hole 20. The common electrode 109 is insulated from the pixel electrode 111 by the interlayer insulating layer 110. In this configuration, a fringe electric field can be produced between the pixel electrode 111 and the common electrode 109.

The oxide semiconductor TFT 10 includes a gate electrode 102 supported on the substrate 101, a gate insulating layer 103 covering the gate electrode 102, an oxide semiconductor layer 104 arranged so as to overlap the gate electrode 102 with the gate insulating layer 103 interposed therebetween, and a source electrode 105 and a drain electrode 106. The oxide semiconductor TFT 10 is a channel etch type TFT which has a bottom gate top contact structure.

The gate electrode 102 is connected with the scan line 102'. The source electrode 105 is connected with the signal line 105'. Note that, as seen from FIG. 1(a), in the oxide semiconductor TFT 10, part of the signal line 105' that is extending in a vertical direction forms the source electrode 105. Note that, however, the present invention is not limited to this example. The source electrode 105 may be provided so as to extend from the signal line 105' in a horizontal direction. The source electrode 105 and the drain electrode 106 are provided on the oxide semiconductor layer 104 so as to oppose each other and to be spaced away from each other. The source electrode 105 and the drain electrode 106 are each in contact with the upper surface of the oxide semiconductor layer 104.

In such a "channel etch type TFT", an etch stop layer is not provided on the channel region, and the channel side edges of the source and drain electrodes 105, 106 are arranged so as to be in contact with the upper surface of the oxide semiconductor layer 104. As will be described later, the channel etch type TFT is formed by, for example, forming an electrically-conductive film for source and drain electrodes on the oxide semiconductor layer 104 and performing source-drain separation. In the source-drain separation step, a surface portion of the channel region is etched in some cases.

In the present embodiment, the source electrode 105 and the drain electrode 106 include the major layer electrodes 105b, 106b (major layer source electrode 105b and major layer drain electrode 106b) which contain Cu, and the lower layer electrodes 105a, 106a (lower layer source electrode 105a and lower layer drain electrode 106a) which are provided under the major layer electrodes 105b, 106b and which are in contact with the oxide semiconductor layer 104.

The major layer electrodes 105b, 106b only need to be a layer which contains Cu as a major constituent and may be a Cu layer which does not substantially contain impurities (a layer which is made of Cu with the purity of not less than 99.99%), a Cu layer which contains impurities, or a Cu alloy layer (e.g., Cu—Ca alloy layer). By forming the major layer electrodes 105b, 106b whose major constituent is Cu that has high electrical conductivity, the resistance can be reduced. Therefore, when used as an active matrix substrate of a display device, deterioration of the display quality which is attributed to delay or deformation of the data signal can be suppressed.

On the other hand, the lower layer electrodes 105a, 106a that are in contact with the oxide semiconductor layer 104 only need to be a layer which does not contain Cu. The lower layer electrodes 105a, 106a may be made of, for example, Ti, TiN, a Ti oxide, or Mo. By thus providing the lower layer electrodes 105a, 106a, the contact resistance between the oxide semiconductor layer 104 and the source and drain electrodes 105, 106 can be reduced. Metal elements such as Ti and Mo are less likely to diffuse into the oxide semiconductor layer 104 than Cu and, therefore, deterioration of the TFT characteristics which is attributed to diffusion of metals can be suppressed.

Here, the edges of the lower layer electrodes 105a, 106a are at positions ahead of the edges of the major layer electrodes 105b, 106b when viewed in a direction perpendicular to the substrate. In other words, the major layer electrodes 105b, 106b are provided on the lower layer electrodes 105a, 106a so as not to cover the peripheries of the lower layer electrodes 105a, 106a.

Figure 2:
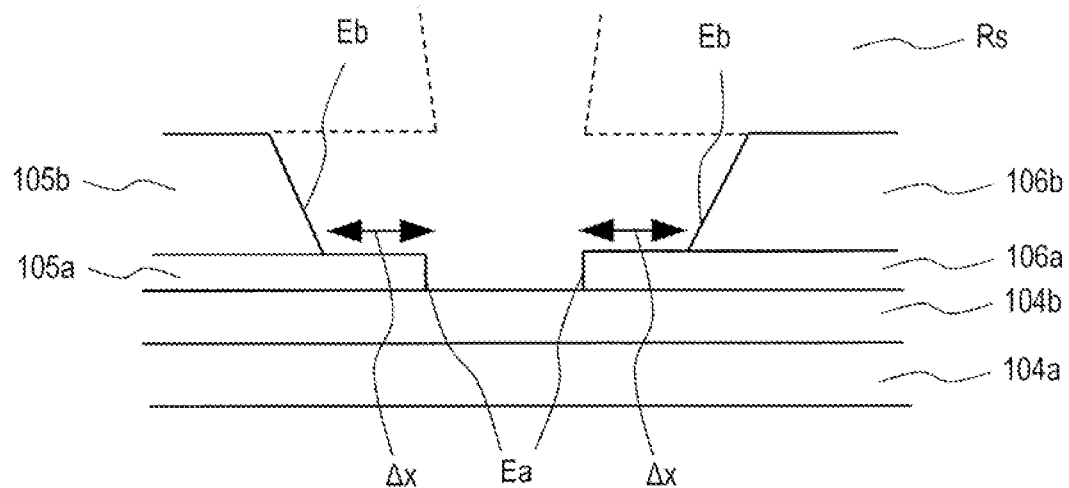
FIG. 2 An enlarged view showing part of the cross-sectional view of FIG. 1(b) near a TFT.

As shown in FIG. 2, on the oxide semiconductor layer 104a, 104b, the edges Ea of the lower layer electrodes 105a, 106a may be ahead of the edges Eb of the major layer 105b, 106b by a distance $\Delta x$ of not less than 0.1 µm and not more than 1.0 µm in an in-plane direction. The above-described distance between the edges, $\Delta x$, is preferably not less than 0.2 µm and not more than 0.4 µm.

The edges Eb of the major layer electrodes 105b, 106b can be tapered as shown in FIG. 2. In this case, the distance between the edges, $\Delta x$, can be defined as the width of part of the lower layer electrode 105a, 106a extended ahead without being covered with the major layer electrode 105a, 106a at the interface between the major layer electrode 105b, 106b and the lower layer electrode 105a, 106a.

In this configuration, diffusion of Cu from the major layer electrodes 105b, 106b that contain Cu into the oxide semiconductor layer 104 is suppressed by the extended parts of the lower layer electrodes 105a, 106a. Particularly, in the source-drain separation step, the major layer electrodes 105b, 106b are patterned by wet etching and, thereafter, the lower layer electrodes 105a, 106a are patterned by dry etching, whereby diffusion of Cu into the oxide semiconductor layer 104 in this step can be reduced.

The gate electrode 102 may have a multilayer structure consisting of a lower gate electrode 102a which does not contain Cu and a major layer gate electrode 102b which contains Cu, as do the source and drain electrodes 105, 106. When the SD layer (a layer including the signal line 105', the source electrode 105 and the drain electrode 106) and the gate layer (a layer including the gate electrode 102 and the gate wire 102') have the same configuration, the manufacturing process can advantageously be simplified.

In the present embodiment, the oxide semiconductor layer 104 includes a lower semiconductor layer 104a formed on the gate insulating layer 103 and an upper semiconductor layer 104b formed on the upper side of the lower semiconductor layer 104a so as to be in contact with the source and drain electrodes 105, 106.

The lower semiconductor layer 104a and the upper semiconductor layer 104b have different compositions (or composition ratios). The compositions of these layers are selected such that the energy gap of the upper semiconductor layer 104b is greater than the energy gap of the lower semiconductor layer 104a. For example, when the oxide semiconductor layer 104 is an InGaZnO semiconductor layer, a layer of small energy gap and high mobility can be formed by increasing the In concentration (atomic fraction) or decreasing the Ga concentration.

Now, the reasons why the two-layer oxide semiconductor layer is provided as described above are described. The surface of the oxide semiconductor layer 104 is susceptible to etching damage in the source-drain separation step, and carriers are likely to be trapped by produced film defects. When the oxide semiconductor layer 104 is realized by a single layer, carriers flow throughout the single layer. Therefore, film defects greatly affect the flow of carriers. When Cu is contained in the SD layer, Cu can diffuse into the oxide semiconductor layer 104 in the source-drain separation step. When the layer through which Cu is diffused is used as the channel, the reliability of the TFT deteriorates.

On the other hand, when the oxide semiconductor layer has a two-layer structure and carriers are selectively allowed to flow through the lower semiconductor layer 104a that has small energy gap and high mobility, it is possible to reduce the probability that film defects and Cu in the upper semiconductor layer 104b affect the flow of carriers. When Cu is contained in the SD layer, Cu is selectively allowed to diffuse into the upper semiconductor layer 104b, and diffusion of Cu into the lower semiconductor layer 104a can be effectively suppressed. Thus, deterioration of the TFT characteristics which is attributed to diffusion of Cu can be prevented.

When an InGaZnO based semiconductor is used, the composition of the lower semiconductor layer 104a that is to be used as the channel is selected such that, for example, In concentration≥Ga concentration. Meanwhile, the composition of the upper semiconductor layer 104b that is to be used as the buffer layer is selected such that, for example, In concentration<Ga concentration. Alternatively, the lower semiconductor layer 104a and the upper semiconductor layer 104b may be configured so as to meet the relationship of "the Ga concentration in the lower semiconductor layer 104a<the Ga concentration in the upper semiconductor layer 104b" (or the relationship of "the In concentration in the lower semiconductor layer 104a>the In concentration in the upper semiconductor layer 104b").

Since diffusion of Cu into the lower semiconductor layer 104a is suppressed as described above, in the present embodiment, the upper semiconductor layer 104b may be a layer which contains Cu while the lower semiconductor layer 104a may be a layer which does not contain (or does not substantially contain) Cu. The concentration of Cu in the lower semiconductor layer 104a is sufficiently lower than the concentration of Cu in the upper semiconductor layer 104b. At the interface between these layers, the Cu concentration may sharply decrease.

Although the oxide semiconductor layer 104 including two layers of different compositions has been described in the foregoing, the oxide semiconductor layer 104 may include three or more layers of different compositions. For example, the third semiconductor layer which has the same composition as that of the upper semiconductor layer 104b may be provided between the lower semiconductor layer 104a and the gate insulating layer 103.

In order to reduce the etching damage to the oxide semiconductor layer in the source-drain separation step, the technique of providing an etch stop layer which is realized by an inorganic insulating layer, such as $SiO_2$, so as to cover the channel of the semiconductor layer has been known. However, in the present embodiment, desirable device characteristics can be achieved without providing such an etch stop layer and, therefore, the manufacturing process can advantageously be simplified. Also, in the present embodiment, the size of the TFT is advantageously small as compared with a configuration in which the etch stop layer is provided.

The oxide semiconductor contained in the above-described oxide semiconductor layer 104 may be an amorphous oxide semiconductor or may be a crystalline oxide semiconductor which includes a crystalline portion. Examples of the crystalline oxide semiconductor include a polycrystalline oxide semiconductor and a microcrystalline oxide semiconductor. Alternatively, the crystalline oxide semiconductor may be a crystalline oxide semiconductor in which the c-axis is oriented generally perpendicular to the layer surface.

As previously described, the oxide semiconductor layer 104 may have a multilayer structure consisting of two or more layers. When the oxide semiconductor layer 104 has a multilayer structure, the oxide semiconductor layer 104 may include a non-crystalline oxide semiconductor layer and a crystalline oxide semiconductor layer. Alternatively, the oxide semiconductor layer 104 may include a plurality of crystalline oxide semiconductor layers which have different crystalline structures. Note that, however, in the present embodiment, when the oxide semiconductor layer 104 has a two-layer structure including the upper layer and the lower layer, it is preferred that the energy gap of the oxide semiconductor contained in the upper layer is greater than the energy gap of the oxide semiconductor contained in the lower layer.

The materials, structures and film formation methods of the non-crystalline oxide semiconductor and the respective aforementioned crystalline oxide semiconductors, and the configuration of the oxide semiconductor layer which has a multilayer structure, are disclosed in, for example, Japanese Laid-Open Patent Publication No. 2014-007399 (Patent Document 2). The entire disclosure of Japanese Laid-Open Patent Publication No. 2014-007399 is incorporated by reference in this specification.

The oxide semiconductor layer 104 may contain, for example, at least one metal element among In, Ga and Zn. In the present embodiment, the oxide semiconductor layer 104 contains, for example, an In—Ga—Zn—O based semiconductor. Here, the In—Ga—Zn—O based semiconductor is a ternary oxide including In (indium), Ga (gallium) and Zn (zinc). The proportion (composition ratio) of In, Ga and Zn is not particularly limited but includes, for example, In:Ga:Zn=2:2:1, In:Ga:Zn=1:1:1, and In:Ga:Zn=1:1:2. The oxide semiconductor layer 104 which has such a composition can be formed by an oxide semiconductor film which contains an In—Ga—Zn—O based semiconductor. Note that a channel etch type TFT which has an active layer containing an In—Ga—Zn—O based semiconductor is also referred to as "CE-InGaZnO-TFT".

The In—Ga—Zn—O based semiconductor may be amorphous or may be crystalline. As the crystalline In—Ga—Zn—O based semiconductor, a crystalline In—Ga—Zn—O based semiconductor in which the c-axis is oriented generally perpendicular to the layer surface is preferred.

The crystalline structure of the crystalline In—Ga—Zn—O based semiconductor is disclosed in, for example, aforementioned Japanese Laid-Open Patent Publication No. 2014-007399, Japanese Laid-Open Patent Publication No. 2012-134475 (Patent Document 1), and Japanese Laid-Open Patent Publication No. 2014-209727. The entire disclosures of Japanese Laid-Open Patent Publication No. 2012-134475 and Japanese Laid-Open Patent Publication No. 2014-209727 are incorporated by reference in this specification. A TFT which includes an In—Ga—Zn—O based semiconductor layer has high mobility (20 times or more as compared with an a-Si TFT) and low current leakage (less than 1/100 as compared with an a-Si TFT), and is therefore suitably used as a driver TFT and a pixel TFT.

The oxide semiconductor layer 104 may contain a different oxide semiconductor instead of the In—Ga—Zn—O based semiconductor. For example, the oxide semiconductor layer 104 may contain an In—Sn—Zn—O based semiconductor (e.g., $In_2O_3$—$SnO_2$—ZnO). In—Sn—Zn—O based semiconductor is a ternary oxide including In (indium), Sn (tin) and Zn (zinc). Alternatively, the oxide semiconductor layer 104 may contain an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, or the like.

Hereinafter, a manufacturing process of the active matrix substrate 100A is described with reference to FIG. 3 and FIG. 4.

Figure 3:
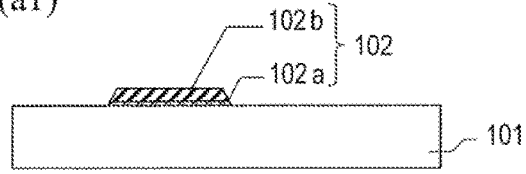
FIG. 3 Diagrams illustrating the manufacturing steps of the semiconductor device of the first embodiment. (a1) to (d1) are cross-sectional views. (a2) to (d2) are corresponding plan views.
Figure 3:
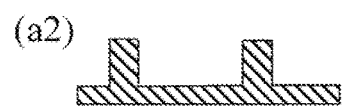
Figure 3:
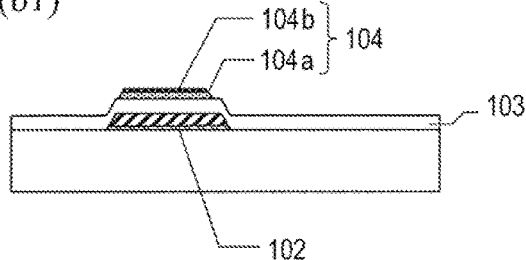
Figure 3:
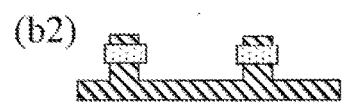
Figure 3:
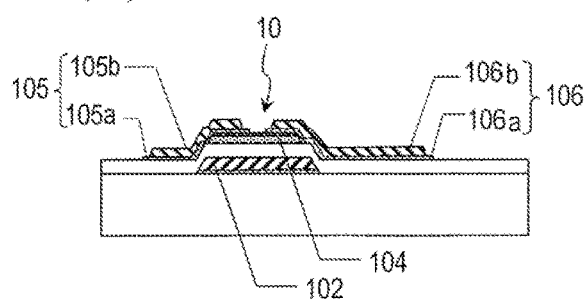
Figure 3:
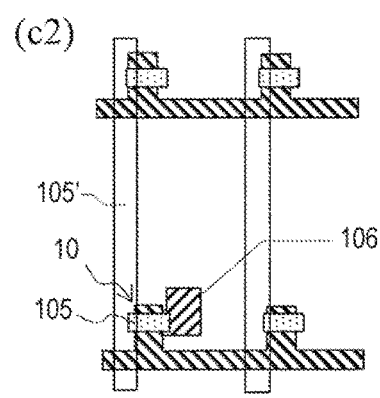
Figure 3:
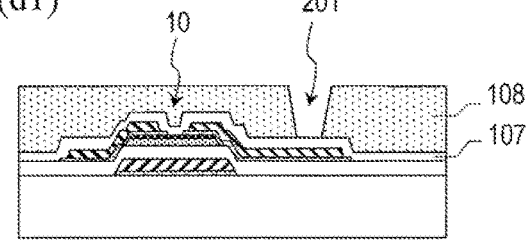
Figure 3:
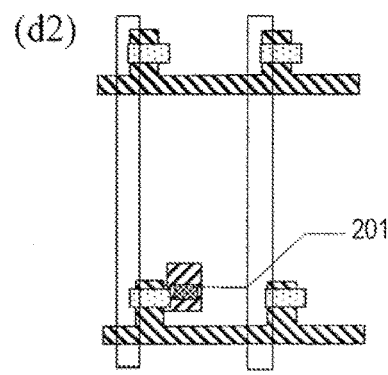

Firstly, as shown in FIGS. 3(*a*1) and 3(*a*2), a gate layer including a gate electrode 102 and a scan line 102' is formed on a substrate 101. As the substrate 101, for example, a glass substrate, a silicon substrate, a heat-resistant plastic substrate (resin substrate), or the like, can be used.

The gate layer is realized by, for example, forming a metal film for the gate (thickness: e.g., not less than 50 nm and not more than 500 nm) on a glass substrate 101 by sputtering and patterning the formed metal film. The patterning is realized by photolithography, wet etching and resist-peeling washing.

In the present embodiment, the metal film for the gate is realized by a Cu/Ti multilayer film which is produced by forming a Ti film (thickness: 5-100 nm) and a Cu film (thickness: 100-500 nm) in this order. Note that, however, the material of the metal film for the gate is not particularly limited. A film which includes a metal, such as aluminum (Al), tungsten (W), molybdenum (Mo), tantalum (Ta), chromium (Cr), titanium (Ti), copper (Cu), or the like, or an alloy thereof, or a metal nitride thereof, can be appropriately used.

Next, as shown in FIGS. 3(*b*1) and 3(*b*2), a gate insulating layer 103 is formed so as to cover the gate electrode 102, and an oxide semiconductor layer 104 is formed typically in the shape of an island so as to at least partially extend over the gate electrode 102 with the gate insulating layer 103 interposed therebetween.

The gate insulating layer 103 can be formed by CVD or the like. As the gate insulating layer 103, a silicon oxide ($SiO_2$) layer, a silicon nitride ($SiN_x$) layer, a silicon oxynitride ($SiO_xN_y$; x>y) layer, a silicon nitroxide ($SiN_xO_y$; x>y) layer, or the like, can be appropriately used. The gate insulating layer 103 may have a multilayer structure. For example, the gate insulating layer 103 may include a 200-500 nm thick $SiN_x$ layer on the substrate side (lower layer) for preventing diffusion of impurities from the substrate 101 and a 25-100 nm thick $SiO_2$ layer on the $SiN_x$ layer.

When a layer which contains oxygen (e.g., an oxide layer such as $SiO_2$) is used as the uppermost layer of the gate insulating layer 103 (i.e., a layer which is in contact with the oxide semiconductor layer 104), oxygen deficiencies in the oxide semiconductor layer 104 can be covered by oxygen contained in the oxide layer. Thus, the oxygen deficiencies in the oxide semiconductor layer 104 can be effectively reduced.

The oxide semiconductor layer 104 is realized by sequentially forming an oxide semiconductor film (thickness: 30-100 nm) for formation of the lower semiconductor layer 104*a* and an oxide semiconductor film (thickness: 10-80 nm) for formation of the upper semiconductor layer 104*b* by sputtering, and patterning the formed films. By using different target materials in the sputtering, oxide semiconductor films of different compositions can be formed. The patterning is realized by photolithography, wet etching and resist-peeling washing.

The lower semiconductor layer 104*a* formed herein is a layer which has a relatively small energy gap and high mobility. When the oxide semiconductor layer 104 is realized by an InGaZnO based semiconductor layer, In, Ga and Zn in the lower semiconductor layer 104*a* may be in the proportion of, for example, 1:1:1. The composition of the lower semiconductor layer 104*a* may be the same as that of an oxide semiconductor layer in a conventional oxide semiconductor TFT in which, for example, the oxide semiconductor layer is realized by a single layer. Note that, in the lower semiconductor layer 104a, the In concentration (at %) may be not less than the Ga concentration (at %).

Meanwhile, the upper semiconductor layer 104b formed herein is a layer which has a relatively large energy gap. When the oxide semiconductor layer 104 is realized by an InGaZnO based semiconductor layer, the upper semiconductor layer 104b may have such a composition that the Ga concentration is high as compared with the lower semiconductor layer and may have such a composition that the In concentration is low as compared with the lower semiconductor layer 104a. In the upper semiconductor layer 104b, the In concentration may be lower than the Ga concentration.

The thickness of the upper semiconductor layer 104b may be smaller than that of the lower semiconductor layer 104a. Although Cu diffuses into the upper semiconductor layer 104b, diffusion of Cu into the lower semiconductor layer 104a can be effectively prevented even if the upper semiconductor layer 104b is not as thick as the lower semiconductor layer 104a. Note that, however, as will be described later, it was verified that the threshold variation of the TFT after aging is suppressed by increasing the thickness of the upper semiconductor layer 104a. From this viewpoint, it is preferred that the upper semiconductor layer 104b is not less than 40 nm.

Thereafter, as shown in FIGS. 3(c1) and 3(c2), a SD layer is formed which includes major layer and lower layer source electrodes 105a, 105b and major layer and lower layer drain electrodes 106a, 106b. Thereby, an oxide semiconductor TFT 10 is obtained.

In this step, firstly, a Ti film is formed by sputtering to a thickness of 5-100 nm, and then, a Cu film is formed to a thickness of 100-500 nm. Then, a resist is provided on the formed Cu/Ti films by photolithography. Note that FIG. 2 shows a resist Rs for formation of the source electrodes 105a, 105b and the drain electrodes 106a, 106b.

Firstly, the Cu film on the upper side is subjected to wet etching with the resist Rs being provided thereon, whereby major layer source/drain electrodes 105b, 106b are formed. The etching solution used can be, for example, an etchant which contains hydrogen peroxide ($H_2O_2$). Here, since the wet etching is isotropic etching, part of the Cu film covered with the resist Rs is also etched in an inward direction from an edge of the resist (side-etched) by a distance $\Delta x$ of, for example, 0.1 μm to 1.0 μm. The amount of the side etching can be controlled by modifying the etching duration or the like. When a sufficient selection ratio is secured, the amount of the side etching can be easily increased by increasing the etching duration.

Then, the Ti film of the lower layer is dry-etched to form lower layer source/drain electrodes 105a, 106a. Here, since the dry etching is anisotropic etching, the etching advances in the thickness direction without substantially etching part of the Ti film covered with the resist Rs. As a result, the edges Ea of the lower layer electrodes are present outside the edges Eb of the major layer electrodes that are within the extent of the resist.

Thereafter, the resist peeling step and the washing step are performed. Thereby, as shown in FIG. 3(c1), source/drain electrodes 105, 106 are obtained which have such a configuration that the edges of the lower layer source/drain electrodes 105a, 106a are ahead of the edges of the major layer source/drain electrodes 105b, 106b by a distance of, for example, 0.1-1.0 μm.

Although the oxide semiconductor layer 104 is partially exposed in the source-drain separation as described above, an increase of the off current and a negative threshold voltage (depression characteristic) are suppressed even if oxygen deficiencies or the like occur in the upper semiconductor layer 104b because the present embodiment is configured such that the lower semiconductor layer 104a can be utilized as the channel.

The content of Cu in the major layer electrodes 105b, 106b may be, for example, not less than 90 at % and is preferably not less than 95 at %. More preferably, the major layer electrodes 105b, 106b are a pure Cu layer (Cu content: e.g., not less than 99.99%). The thickness of the major layer electrodes 105b, 106b may be, for example, not less than 100 nm and not more than 500 nm. If it is not less than 100 nm, low-resistance electrodes and wires can be formed. If it exceeds 500 nm, film breakage or the like is likely to occur in the overlying protecting layer 107.

It is preferred that the thickness of the lower layer electrodes 105b, 106b is smaller than that of the major layer electrodes 105a, 106a. This can decrease the on-resistance. The thickness of the lower layer electrodes may be, for example, not less than 5 nm and not more than 100 nm. If it is not less than 5 nm, the contact resistance between the oxide semiconductor layer 104 and the source and drain electrodes 105, 106 can be reduced more effectively. Also, diffusion of Cu into the oxide semiconductor layer 104 can be suppressed more surely. If it is not more than 100 nm, the effect of reducing the contact resistance is achieved without increasing the total thickness of the metal films for source wires.

After the SD layer is formed, a plasma treatment may be performed using a gas which contains oxygen. Thereby, the oxygen content in the oxide semiconductor layer 104 that is exposed between the source and drain electrodes 105, 106 can be increased. More specifically, for example, a $N_2O$ plasma treatment may be performed under the following conditions: $N_2O$ gas flow rate 3000 sccm; Pressure 200 Pa; Plasma power density 0.15 W/cm$^2$; Treatment duration 10-30 sec; Substrate temperature 200° C. The oxidation treatment is not limited to a plasma treatment with the use of a $N_2O$ gas. For example, the oxidation treatment can be realized by a plasma treatment with the use of an $O_2$ gas, an ozone treatment, or the like. To perform the treatment without increasing the number of steps, the treatment is desirably performed immediately before the formation step of the protecting layer 107 which will be described later. Specifically, when the protecting layer 107 is formed by CVD, a $N_2O$ plasma treatment can be performed. When the protecting layer 107 is formed by sputtering, an $O_2$ plasma treatment can be performed. Alternatively, the oxidation treatment may be realized by an $O_2$ plasma treatment in an ashing machine.

Then, a protecting layer 107 and a flattening layer 108 are provided so as to cover the oxide semiconductor TFT 10 as shown in FIGS. 3(d1) and 3(d2). The protecting layer 107 is obtained by, for example, forming a $SiO_2$ film to a thickness of 100-400 nm by CVD and forming a $SiN_x$ film on the $SiO_2$ film to a thickness of 20-200 nm. The flattening layer 108 provided on the protecting layer 107 is obtained by, for example, applying a 1-3 μm thick organic insulating film (e.g., UV-curable resin). In this organic insulating film, an opening 201 is formed by photolithography. Note that after the protecting layer 107 is provided, a heat treatment may be performed at a temperature of, for example, not less than 300° C. Thereby, the TFT characteristics can be made more stable.

Figure 4:
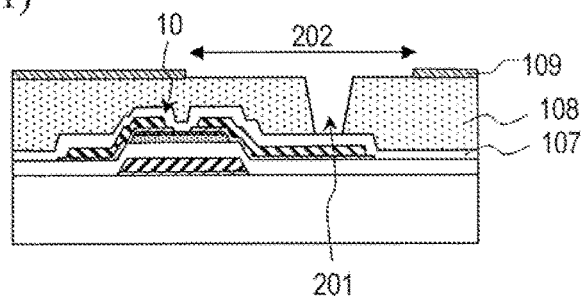
FIG. 4 Diagrams illustrating the manufacturing steps of the semiconductor device of the first embodiment. (e1) to (g1) are cross-sectional views. (e2) to (g2) are corresponding plan views.
Figure 4:
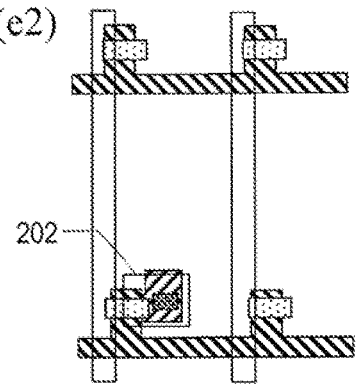
Figure 4:
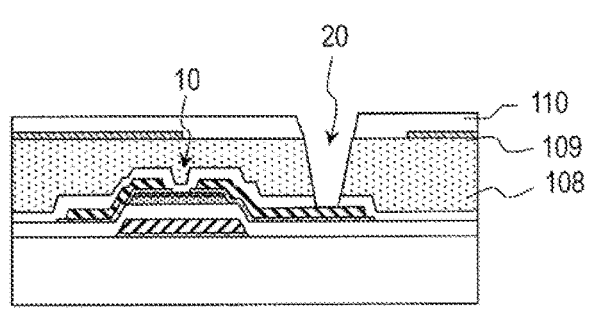
Figure 4:
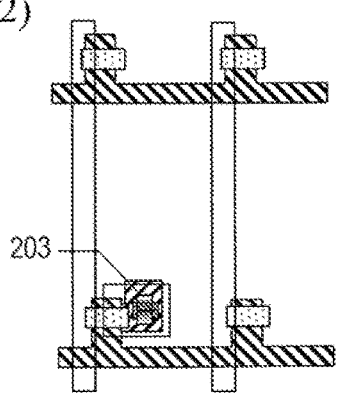
Figure 4:
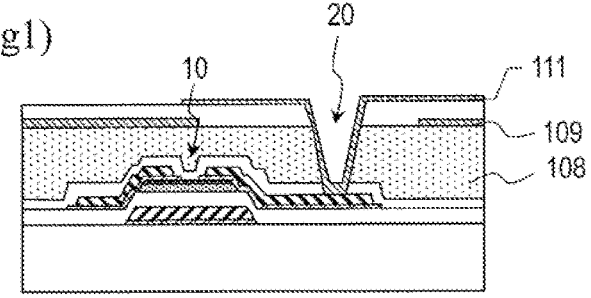
Figure 4:
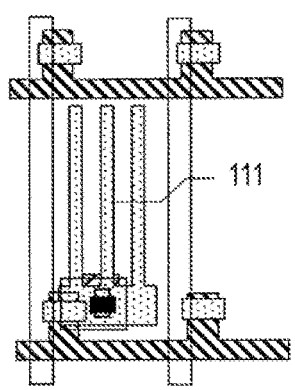

Thereafter, as shown in FIGS. 4(*e*1) and 4(*e*2), a common electrode 109 is formed on the flattening layer 108. The common electrode 109 is obtained by, for example, depositing an ITO film by sputtering to a thickness of 50-200 nm and thereafter patterning this ITO film by photolithography, wet etching and resist-peeling washing. The common electrode 109 has an opening 202 extending to a region outside the opening 201.

Thereafter, as shown in FIGS. 4(*f*1) and 4(*f*2), an interlayer insulating layer 110 is formed so as to cover the common electrode 109. The interlayer insulating layer 110 is obtained by, for example, forming a $SiO_2$ film by CVD to a thickness of 100-400 nm, patterning this $SiO_2$ film by photolithography, and thereafter forming an opening 203 by dry etching. In the etching step for formation of the opening 203, the protecting layer 107 covering the oxide semiconductor TFT 10 is also etched, so that an extended portion of the drain electrode 106 can be exposed at the bottom surface.

Thereafter, a pixel electrode 111 is formed as shown in FIGS. 4(*g*1) and 4(*g*2). The pixel electrode 111 is obtained by depositing an ITO film by sputtering to a thickness of 50-200 nm and thereafter patterning this ITO film by photolithography, wet etching and resist-peeling washing. The pixel electrode 111 is formed so as to be connected with the drain electrode of the oxide semiconductor TFT 10 in the contact hole 20. The pixel electrode 111 may have a planar shape which includes a plurality of linear portions (or at least one slit) as shown in FIG. 4(*g*2). Note that, however, the pixel electrode 111 is not limited to this example. When used in a liquid crystal display device which operates in a VA (Vertical Alignment) mode, the pixel electrode 111 may have a shape extending over the entirety of a rectangular region surrounded by the signal lines 105' and the scan lines 102'.

Through the above-described process, an active matrix substrate which includes an oxide semiconductor TFT can be manufactured.

Figure 8:
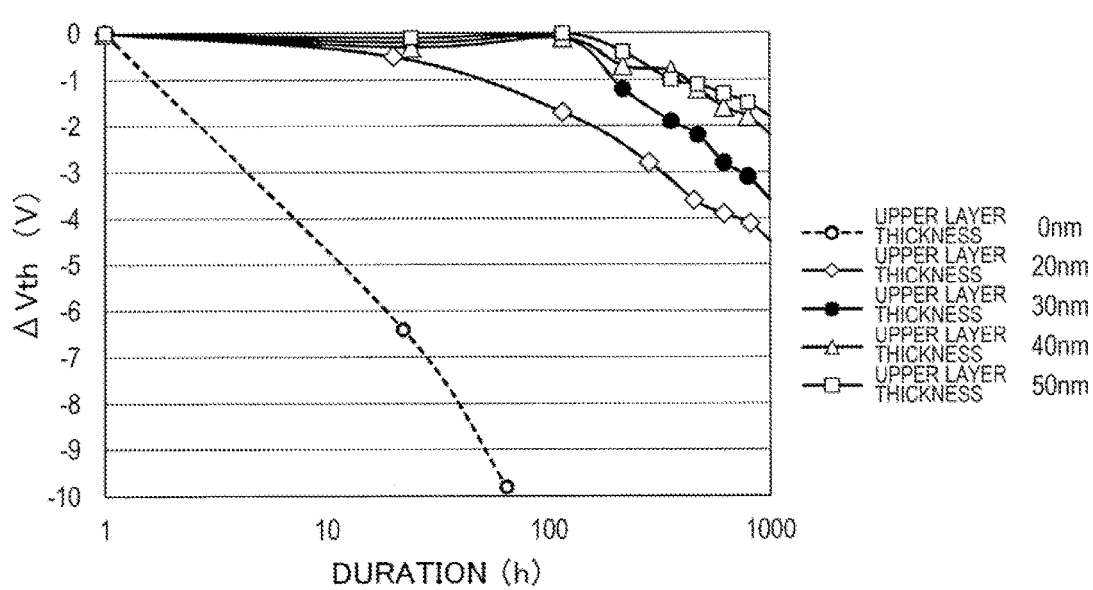
FIG. 8 A graph showing the relationship between the aging duration and the threshold voltage variation ΔVth with varying thicknesses of the upper semiconductor layer in an oxide semiconductor TFT.

FIG. 8 shows the results of an actual driving test in a 60° C. environment of the oxide semiconductor TFT 10 that has the configuration shown in FIG. 2, where the variation of the threshold voltage Vth of the TFT with respect to the operation time was measured with varying thicknesses of the upper semiconductor layer 104*b*. Note that the thickness of the lower semiconductor layer 104*a* was constantly 60 nm.

As seen from FIG. 8, when the thickness of the upper semiconductor layer 104*b* is 0 nm (i.e., when the upper semiconductor layer 104*b* is not provided), the threshold voltage Vth greatly decreases as the driving time increases. When the threshold voltage Vth thus shifts to the negative side, problems such as increase of the off-leak current and exhibition of the normally-on state can arise. On the other hand, as seen from the graphs of 20 nm, 30 nm, 40 nm and 50 nm, the variation of the threshold voltage, ΔVth, can be effectively suppressed by increasing the thickness of the upper semiconductor layer 104*b*. Particularly, it can be appreciated that when it is not less than 40 nm (40 nm, 50 nm), the variation of the threshold voltage, ΔVth, can be effectively suppressed.

(Second Embodiment)

Hereinafter, the second embodiment of the semiconductor device of the present invention is described. The semiconductor device 100B of the present embodiment is different from the first embodiment in that, in the oxide semiconductor TFT 10, the source and drain electrodes 105, 106 include upper layer electrodes 105*c*, 106*c* which contain a Cu alloy on the major layer electrodes 105*b*, 106*b* whose major constituent is Cu. Note that components which are equivalent to those of the first embodiment are designated by the same reference numerals, and detailed descriptions thereof are sometimes omitted.

Figure 5:
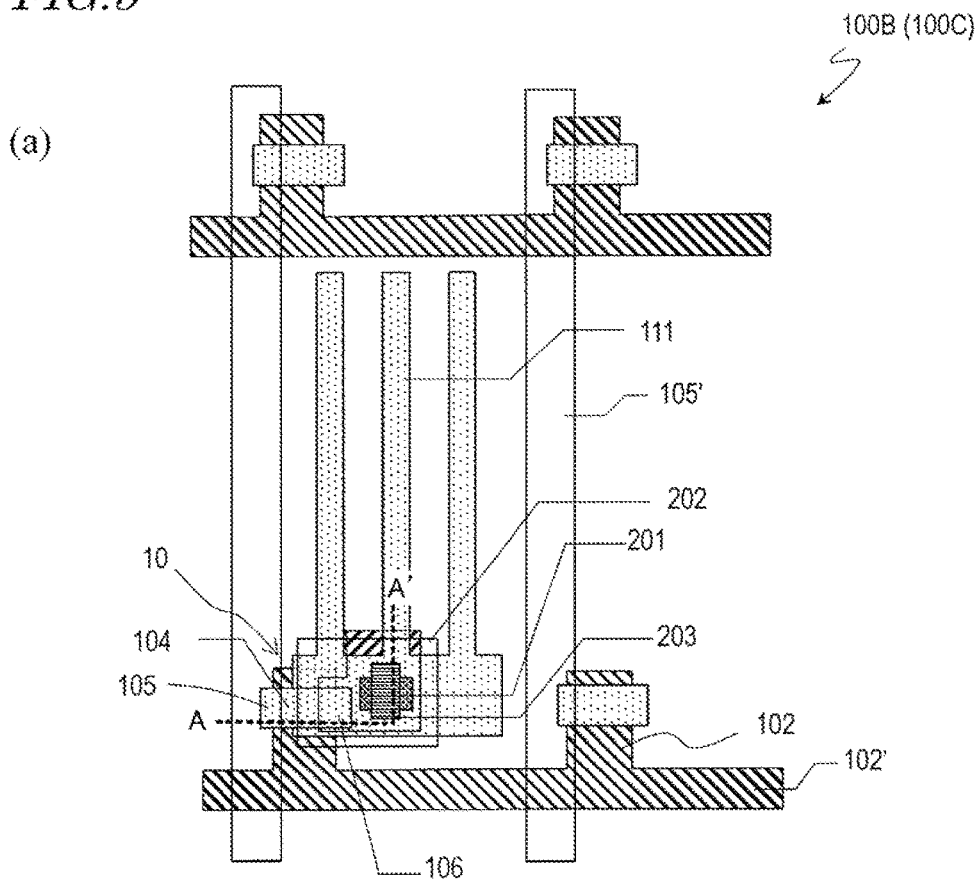
FIG. 5A schematic cross-sectional view of semiconductor devices (active matrix substrates) of the second and third embodiments. (a) is a plan view. (b) is a cross-sectional view taken along line A-A' of (a).
Figure 5:
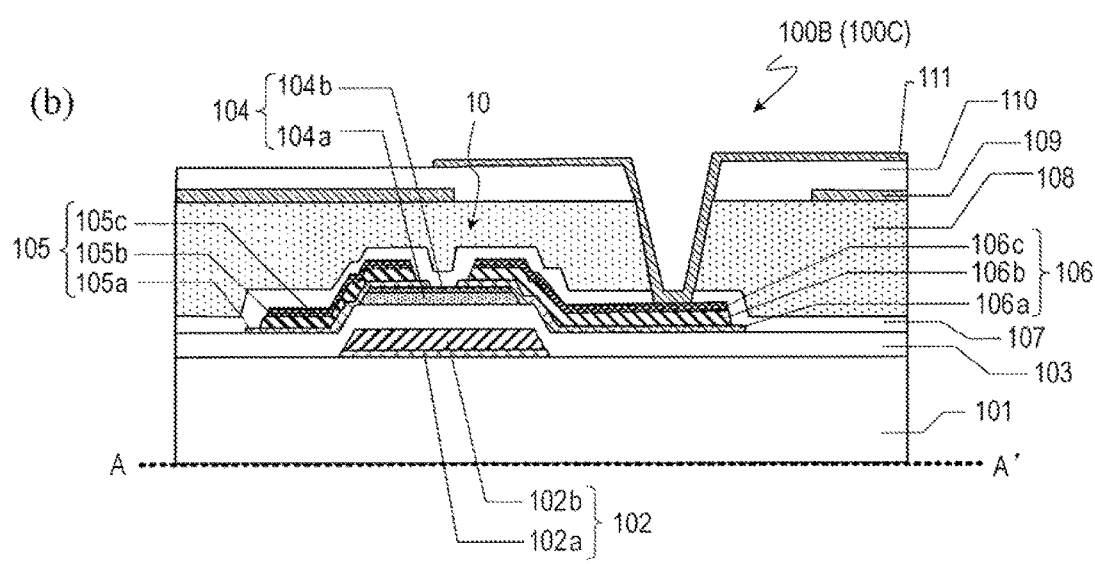

FIGS. 5(*a*) and 5(*b*) are schematic plan and cross-sectional views of a region corresponding to one pixel of an active matrix substrate (semiconductor device) 100B of the second embodiment. FIG. 5(*b*) shows a cross section taken along line A-A' of FIG. 5(*a*).

The active matrix substrate 100B of the present embodiment also includes an oxide semiconductor TFT 10 provided on a substrate 101, a protecting layer 107 and a flattening layer 108 covering the oxide semiconductor TFT 10, and a pixel electrode 111 electrically connected to the oxide semiconductor TFT 10, as does the active matrix substrate 100A of the first embodiment. The oxide semiconductor TFT 10 is driven by a scan line 102' extending in a horizontal direction and a signal line 105' extending in a vertical direction.

The active matrix substrate 100B of the present embodiment also includes a common electrode 109 on the flattening layer 108, as does the active matrix substrate 100A. The common electrode 109 is insulated from the pixel electrode 111 by the interlayer insulating layer 110. In this configuration, a fringe electric field can be formed between the pixel electrode 111 and the common electrode 109. Note that the components other than the oxide semiconductor TFT 10 are the same as those of the active matrix substrate 100A and, therefore, descriptions thereof are herein omitted.

In the present embodiment, the oxide semiconductor TFT 10 includes a gate electrode 102 supported on the substrate 101, a gate insulating layer 103 covering the gate electrode 102, an oxide semiconductor layer 104 arranged so as to extend over the gate electrode 102 with the gate insulating layer 103 interposed therebetween, a source electrode 105 and a drain electrode 106. The oxide semiconductor TFT 10 is a channel etch type TFT which has a bottom gate top contact structure.

Here, the source and drain electrodes 105, 106 of the oxide semiconductor TFT 10 include major layer electrodes 105*b*, 106*b* (a major layer source electrode 105*b* and a major layer drain electrode 106*b*) which contain Cu and lower layer electrodes 105*a*, 106*a* (a lower layer source electrode 105*a* and a lower layer drain electrode 106*a*) which are provided under the major layer electrodes 105*b*, 106*b* and which are in contact with the oxide semiconductor layer 104. In the present embodiment, the source and drain electrodes 105, 106 include upper layer electrodes 105*c*, 106*c* provided on the major layer electrodes 105*b*, 106*b*.

The upper layer electrodes 105*c*, 106*c* may be made of a material which contains a Cu alloy. The upper layer electrodes 105*c*, 106*c* may contain, as the Cu alloy, for example, a CuMgAl based alloy as a major constituent. Alternatively, the upper layer electrodes 105*c*, 106*c* may contain a CuCa based alloy as a major constituent.

Note that the major layer electrodes 105*b*, 106*b* only need to be a layer which contains Cu as a major constituent as in the first embodiment. By forming the major layer electrodes 105*b*, 106*b* which contain Cu that has high electrical conductivity, small on-resistance can be achieved. The lower layer electrodes 105*a*, 106*a* only need to be a layer which does not contain Cu. For example, the lower layer electrodes 105*a*, 106*a* may be made of Ti, TiN, a Ti oxide, Mo, or the like.

Here, the edges of the lower layer electrodes 105*a*, 106*a* are at positions ahead of the edges of the major layer electrodes 105*b*, 106*b* and the upper layer electrodes 105*c*, 106*c* when viewed in a direction perpendicular to the substrate. In other words, the major layer electrodes 105*b*, 106b and the upper layer electrodes 105c, 106c are provided on the lower layer electrodes 105a, 106a so as not to cover the peripheries of the lower layer electrodes 105a, 106a. The edges of the upper layer electrodes 105c, 106c may coincide with the edges of the major layer electrodes 105b, 106b.

As shown in FIG. 2, also in the present embodiment, the edges Ea of the lower layer electrodes 105a, 106a may be ahead of the edges Eb of the major layer electrodes 105b, 106b (and the upper layer electrodes 105c, 106c) by a distance of not less than 0.1 µm and not more than 1.0 µm in an in-plane direction. The distance between the edges, Δx, may be not less than 0.2 µm and not more than 0.4 µm.

By thus arranging the electrodes such that the edges Ea of the lower layer electrodes 105a, 106a are ahead of the edges Eb of the major layer electrodes 105b, 106b, diffusion of Cu from the major layer electrodes 105b, 106b into the oxide semiconductor layer 104 can be suppressed.

Also in the present embodiment, the oxide semiconductor layer 104 includes a lower semiconductor layer 104a formed on the gate insulating layer 103 and an upper semiconductor layer 104b formed on the upper side of the lower semiconductor layer 104a so as to be in contact with the source and drain electrodes 105, 106. The lower semiconductor layer 104a and the upper semiconductor layer 104b may have the same configuration as that of the first embodiment. The upper semiconductor layer 104b only needs to have a greater energy gap than that of the lower semiconductor layer 104a.

In the present embodiment, the upper layer electrodes 105c, 106c that contain a Cu alloy are provided, whereby oxidation of the surfaces of the major layer electrodes 105b, 106b can be suppressed. Particularly when the Cu alloy contains a metal element which is more susceptible to oxidation than Cu, oxidation of Cu can be suppressed more effectively. As a result, corrosion of the electrodes which is attributed to oxidation of Cu can be suppressed effectively, and increase of the contact resistance between the SD layer and another electrically-conductive layer (for example, the pixel electrode 111) can be suppressed.

Since the Cu alloy layer is provided at the surface and would not change in color due to oxidation as Cu does, a highly distinguishable alignment mark can be formed by the utilization of a desirable reflectance of the Cu alloy surface.

Further, by covering the surface with the Cu alloy layer, diffusion of Cu from the major layer can be suppressed more effectively. Particularly when a $N_2O$ plasma treatment is performed after formation of the SD layer as described above, diffusion of Cu can be suppressed effectively.

Hereinafter, a manufacturing process of the active matrix substrate 100B is described with reference to FIG. 6 and FIG. 7.

Figure 6:
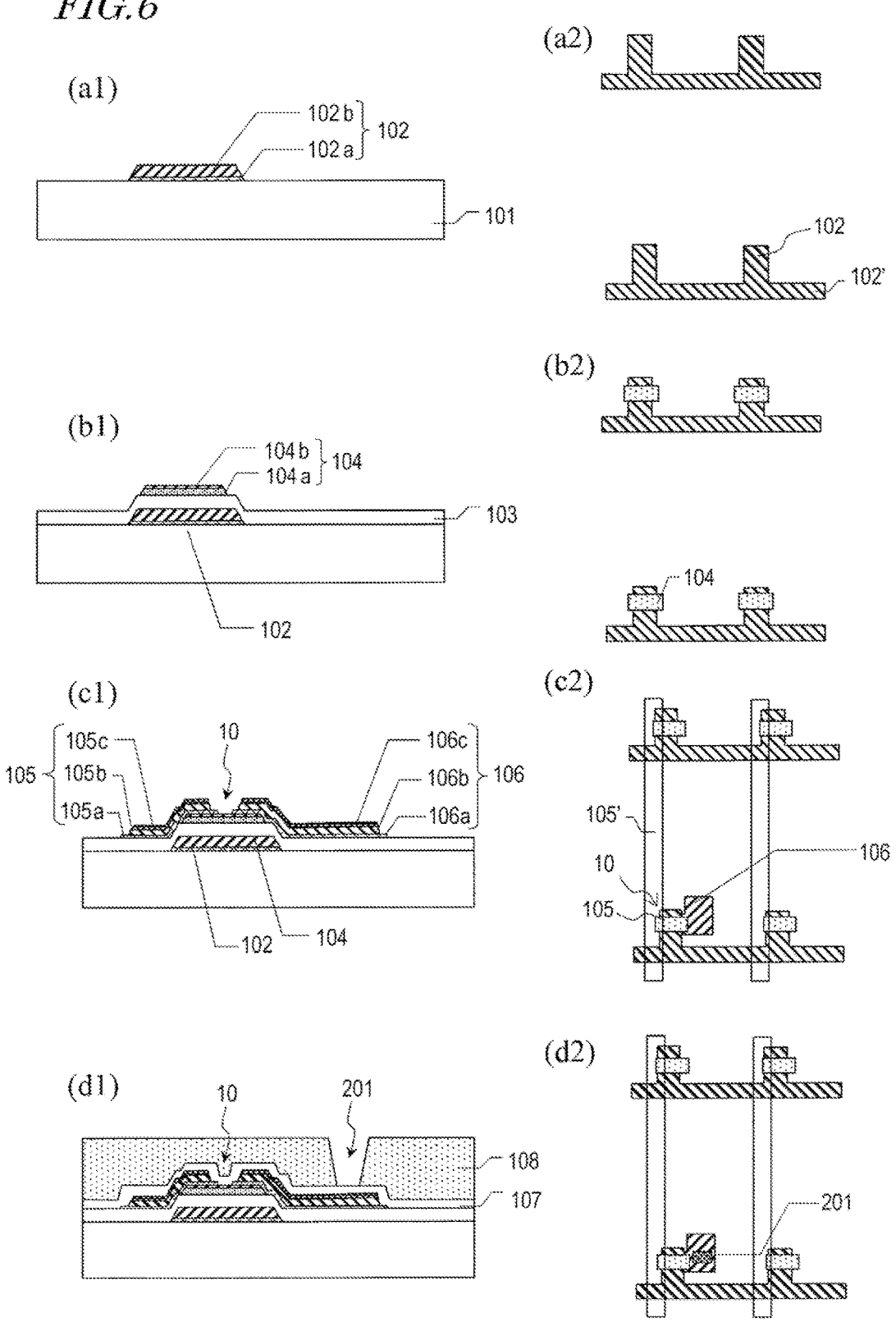
FIG. 6 Diagrams illustrating the manufacturing steps of the semiconductor devices of the second and third embodiments. (a1) to (d1) are cross-sectional views. (a2) to (d2) are corresponding plan views.

As shown in FIGS. 6(a1), 6(a2), 6(b1) and 6(b2), a gate electrode 102, a gate insulating layer 103 and an oxide semiconductor layer 104 are formed on a substrate 101. These steps are the same as those of the first embodiment which have been described with reference to FIGS. 3(a1), 3(a2), 3(b1) and 3(b2) and, therefore, descriptions thereof are herein omitted.

Thereafter, as shown in FIGS. 6(c1) and 6(c2), a SD layer is formed which includes lower layer, major layer and upper layer source electrodes 105a, 105b, 105c and lower layer, major layer and upper layer drain electrodes 106a, 106b, 106c.

In this step, firstly, a Ti film is formed by sputtering to a thickness of 5-100 nm. Then, a Cu film is formed to a thickness of 100-500 nm and, furthermore, a Cu alloy film is formed to a thickness of 20-60 nm. Then, a resist is provided on the formed Cu alloy/Cu/Ti films by photolithography.

The Cu alloy film and the Cu film on the upper side are subjected to wet etching with the resist being provided thereon, whereby upper layer and major layer source/drain electrodes 105c, 106c, 105b, 106b are formed. The etching solution used can be, for example, an etchant which contains hydrogen peroxide ($H_2O_2$). Here, since the wet etching is isotropic etching, part of the Cu alloy film and the Cu film covered with the resist is also etched in an inward direction from an edge of the resist (side-etched) by a distance Δx of, for example, 0.1 µm to 1.0 µm. The amount of the side etching can be controlled by modifying the etching duration or the like.

Then, the Ti film of the lower layer is dry-etched to form lower layer source/drain electrodes 105a, 106a. As a result, the edges of the lower layer electrodes are present outside the edges of the upper layer and major layer electrodes that are within the extent of the resist.

Thereafter, the resist peeling step and the washing step are performed. Thereby, as shown in FIG. 6(c1), source/drain electrodes 105, 106 are obtained which have such a configuration that the edges of the lower layer source/drain electrodes 105a, 106a are ahead of the edges of the major layer source/drain electrodes 105b, 106b by a distance of, for example, 0.1-1.0 µm. Thus, an oxide semiconductor TFT 10 is obtained.

The content of Cu in the major layer electrodes 105b, 106b may be, for example, not less than 90 at % and may preferably be not less than 95 at %. More preferably, the major layer electrodes 105b, 106b are a pure Cu layer (Cu content: e.g., not less than 99.99 at %).

The upper layer electrodes 105c, 106c may be made of, for example, a CuMgAl based alloy or a CuCa based alloy. The content of Cu in the upper layer electrodes 105c, 106c (Cu alloy) may be, for example, not less than 80 at %, preferably not less than 90 at %. As an additive metal element in the Cu alloy, the upper layer electrodes 105c, 106c preferably contain a metal element which is more susceptible to oxidation than Cu. For example, the upper layer electrodes 105c, 106c may contain, as the additive metal element, at least one metal element selected from the group consisting of Mg, Al, Ti, Ca, Mo and Mn. Thereby, oxidation of Cu can be suppressed more effectively. The fraction of the additive metal element with respect to the Cu alloy (when two or more additive metal elements are contained, the fraction of each additive metal element) may be more than 0 at % and not more than 10 at %. Preferably, it is not less than 1 at % and not more than 10 at %.

Then, as shown in FIGS. 6(d1) and 6(d2), a protecting layer 107 and a flattening layer 108 are provided. This step may be the same as that of the first embodiment which has been described with reference to FIGS. 3(d1) and 3(d2). Note that, after the protecting layer 107 is provided, a heat treatment may be performed at a temperature of, for example, not less than 300° C.

Figure 7:
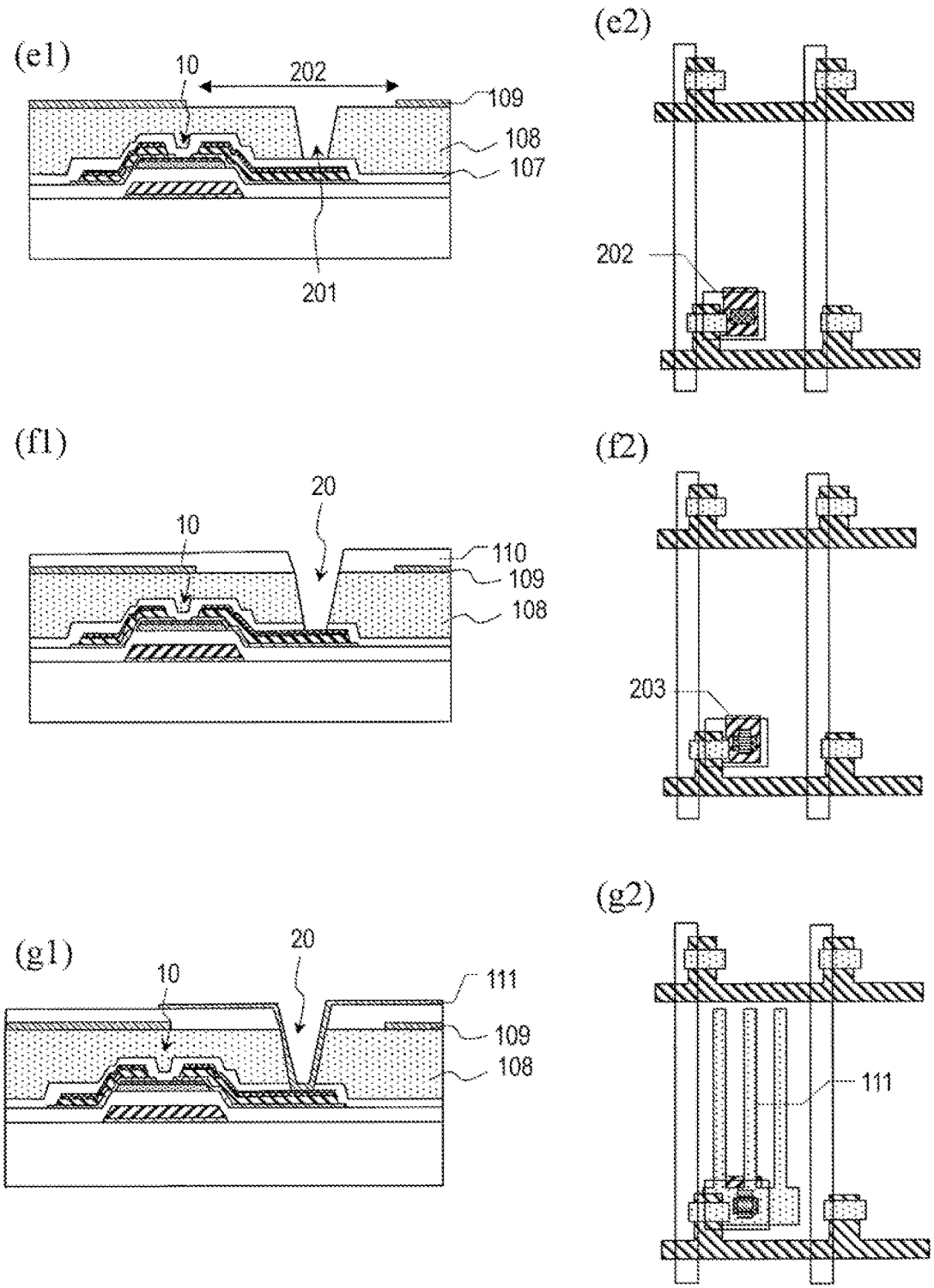
FIG. 7 Diagrams illustrating the manufacturing steps of the semiconductor devices of the second and third embodiments. (e1) to (g1) are cross-sectional views. (e2) to (g2) are corresponding plan views.

Thereafter, as shown in FIGS. 7(e1), 7(e2), 7(f1), 7(f2), 7(g1) and 7(g2), a common electrode 109 is formed on the flattening layer 108, an interlayer insulating layer 110 is formed so as to cover the common electrode 109, and a pixel electrode 111 is formed so as to be connected with the oxide semiconductor TFT 10 in the contact hole 20. These steps may be the same as those of the first embodiment which have been described with reference to FIGS. 4(e1), 4(e2), 4(f1), 4(f2), 4(g1) and 4(g2).

(Third Embodiment)

Hereinafter, the third embodiment of the semiconductor device of the present invention is described. The semiconductor device 100C of the present embodiment is different from the second embodiment in that, in the oxide semiconductor TFT 10, the upper layer electrodes 105c, 106c provided over the major layer electrodes 105b, 106b contain a Mo alloy rather than a Cu alloy. The other components are the same as those of the second embodiment and, therefore, detailed descriptions thereof are herein omitted.

The semiconductor device 100C of the present embodiment has the same configuration as that of the semiconductor device 100B of the second embodiment shown in FIGS. 5(a) and 5(b). That is, also in the present embodiment, the oxide semiconductor TFT 10 is a channel etch type TFT which has a bottom gate top contact structure. The oxide semiconductor layer 104 includes a lower semiconductor layer 104a formed on a gate insulating layer 103 and an upper semiconductor layer 104b formed on the upper side of the lower semiconductor layer 104a so as to be in contact with the source and drain electrodes 105, 106. The upper semiconductor layer 104b has a greater energy gap than that of the lower semiconductor layer 104a.

The semiconductor device 100C of the present embodiment can be manufactured through the same process as that illustrated in FIG. 6 and FIG. 7 and, therefore, detailed description thereof is herein omitted.

Note that, however, in the present embodiment, in the SD layer formation step shown in FIGS. 6(c1) and 6(c2), a Mo alloy is used as a constituent material of the upper layer electrodes 105c, 106c.

More specifically, in the step shown in FIGS. 6(c1) and 6(c2), firstly, a Ti film is formed by sputtering to a thickness of 5-100 nm. Then, a Cu film is formed to a thickness of 100-500 nm and, furthermore, a Mo alloy film is formed to a thickness of 20-60 nm. Then, a resist is provided on the formed Mo alloy/Cu/Ti films by photolithography.

The Mo alloy film and the Cu film on the upper side are first subjected to wet etching with the resist being provided thereon, whereby upper layer and major layer source/drain electrodes 105c, 106c, 105b, 106b are formed. The etching solution used can be, for example, an etchant which contains hydrogen peroxide ($H_2O_2$).

Thereafter, the Ti film of the lower layer is dry-etched to form lower layer source/drain electrodes 105a, 106a. As a result, the edges of the lower layer electrodes are present outside the edges of the upper layer and major layer electrodes that are within the extent of the resist.

Thereafter, the resist peeling step and the washing step are performed. Thereby, as shown in FIG. 6(c1), source/drain electrodes 105, 106 are obtained which have such a configuration that the edges of the lower layer source/drain electrodes 105a, 106a are ahead of the edges of the major layer source/drain electrodes 105b, 106b by a distance of, for example, 0.1-1.0 μm. Thus, an oxide semiconductor TFT 10 is obtained.

The content of Cu in the major layer electrodes 105b, 106b may be, for example, not less than 90 at % and, more preferably, not less than 95 at %. Still more preferably, the major layer electrodes 105b, 106b are a pure Cu layer (Cu content: e.g., not less than 99.99 at %).

The upper layer electrodes 105c, 106c may be made of, for example, a MoNiNb based alloy. The content of Mo in the upper layer electrodes 105c, 106c (Mo alloy) may be, for example, not less than 50 at %. As an additive metal element in the Mo alloy, the upper layer electrodes 105c, 106c may contain at least one metal element selected from the group consisting of Ni, Nb, Ta, Ti and W, for example.

By providing the thus-configured upper layer electrodes 105c, 106c, oxidation of the surfaces of the major layer electrodes 105b, 106b can be suppressed, and increase of the contact resistance between the SD layer and another electrically-conductive layer (for example, the pixel electrode 111) can be suppressed.

Also, a highly distinguishable alignment mark can be formed by the utilization of a desirable reflectance of the Mo alloy surface. Further, by covering the surface with the Mo alloy layer, diffusion of Cu can be suppressed effectively when a $N_2O$ plasma treatment is performed after formation of the SD layer.

Although embodiments of the present invention have been described in the foregoing, the present invention may include other various embodiments. For example, although an oxide semiconductor TFT for use as a pixel TFT which is connected with a pixel electrode has been described in the foregoing, the present invention may be applied to a TFT included in a driver which is monolithically provided in an active matrix substrate.

INDUSTRIAL APPLICABILITY

The present invention is widely applicable to an oxide semiconductor TFT and a variety of semiconductor devices which include the oxide semiconductor TFT. For example, the present invention is also applicable to circuit boards such as active matrix substrates and the like, display devices such as liquid crystal display devices, organic electroluminescence (EL) display devices, inorganic electroluminescence display devices, and the like, imaging devices such as image sensor devices and the like, and various electronic devices such as image input devices, fingerprint readers, semiconductor memories and the like.

REFERENCE SIGNS LIST 10 oxide semiconductor TFT
20 contact hole
100A semiconductor device
101 substrate
102 gate electrode
102' scan line
103 gate insulating layer
104 oxide semiconductor layer
104a lower semiconductor layer
104b upper semiconductor layer
105 source electrode
105' signal line
105a lower layer source electrode
105b major layer source electrode
105c upper layer source electrode
106 drain electrode
106a lower layer drain electrode
106b major layer drain electrode
106c upper layer drain electrode
107 protecting layer
108 flattening layer
109 common electrode
110 interlayer insulating layer
111 pixel electrode

What is claimed is:

1. A semiconductor device, comprising:
a substrate; and
a thin film transistor supported by the substrate, the thin film transistor including a gate electrode, an oxide semiconductor layer, a gate insulating layer provided between the gate electrode and the oxide semiconductor layer, and a source electrode and a drain electrode which are electrically connected to the oxide semiconductor layer,
wherein the oxide semiconductor layer includes an upper semiconductor layer which is in contact with the source electrode and the drain electrode and which has a first energy gap, and a lower semiconductor layer which is provided under the upper semiconductor layer and which has a second energy gap that is smaller than the first energy gap,
the source electrode and the drain electrode include a lower layer electrode which is in contact with the oxide semiconductor layer and which does not contain Cu, and a major layer electrode which is provided over the lower layer electrode and which contains Cu, and
an edge of the lower layer electrode is at a position ahead of an edge of the major layer electrode, and a part of an upper surface of the lower layer electrode is not covered with the major layer electrode.

2. The semiconductor device of claim 1, wherein the edge of the lower layer electrode is ahead of the edge of the major layer electrode by a distance of not less than 0.1 μm and not more than 1.0 μm.

3. The semiconductor device of claim 2, wherein the edge of the lower layer electrode is ahead of the edge of the major layer electrode by a distance of not less than 0.2 μm and not more than 0.4 μm.

4. The semiconductor device of claim 1, wherein
the major layer electrode contains Cu in a proportion of not less than 90 at %, and
the lower layer electrode contains Ti or Mo.

5. The semiconductor device of claim 1, wherein the oxide semiconductor layer contains In, Ga and Zn.

6. The semiconductor device of claim 5, wherein the oxide semiconductor layer includes a crystalline portion.

7. The semiconductor device of claim 5, wherein a Ga concentration in the upper semiconductor layer is higher than a Ga concentration in the lower semiconductor layer.

8. The semiconductor device of claim 5 wherein
in the upper semiconductor layer, the Ga concentration is higher than an In concentration, and
in the lower semiconductor layer, the Ga concentration is not more than an In concentration.

9. The semiconductor device of claim 1, wherein
a thickness of the upper semiconductor layer is not less than 10 nm and not more than 80 nm,
a thickness of the lower semiconductor layer is not less than 30 nm and not more than 100 nm, and
the lower semiconductor layer is greater in thickness than the upper semiconductor layer.

10. The semiconductor device of claim 1, wherein
Cu is diffused in the upper semiconductor layer, and
Cu is not diffused in the lower semiconductor layer.

11. The semiconductor device of claim 1, wherein
the source electrode and the drain electrode further include an upper layer electrode provided over the major layer electrode, and
the upper layer electrode contains a Cu alloy or a Mo alloy.

12. The semiconductor device of claim 1, wherein the thin film transistor has a channel etch structure.

* * * * *